(12) United States Patent
Nagata et al.

(10) Patent No.: US 6,316,814 B1
(45) Date of Patent: Nov. 13, 2001

(54) SOLID IMAGING DEVICE (75) Inventors: Tsuyoshi Nagata; Masayuki Furumiya; Yasutaka Nakashiba, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/477,799

(22) Filed: Jan. 5, 2000

(30) Foreign Application Priority Data

Feb. 24, 1999 (JP) .................................................. 11-047209

(51) Int. Cl.$^7$ .......................... H01L 27/148; H01L 29/768
(52) U.S. Cl. .......................... 257/435; 257/232; 257/233; 257/249
(58) Field of Search .................................. 257/232, 233, 257/249, 250, 435

(56) References Cited

U.S. PATENT DOCUMENTS

| 5,028,972 | * | 7/1991 | Watanabe et al. . | |
| 5,250,825 | * | 10/1993 | Negishi et al. | 257/232 |
| 5,514,888 | * | 5/1996 | Sano et al. | 257/232 |
| 5,929,470 | * | 7/1999 | Harada et al. | 257/233 |
| 6,133,595 | * | 10/2000 | Senda | 257/232 |

* cited by examiner

Primary Examiner—Ngân V. Ngô
(74) Attorney, Agent, or Firm—Young & Thompson (57) ABSTRACT

A solid imaging device having a high sensitivity includes a photoelectric conversion region, a light shielding film having an aperture disposed above the photoelectric conversion region, and a plurality of wiring layers and wherein a portion of one wiring layer protrudes from the edge of the aperture, when viewed from the top of the aperture, so as to shield the light incident to the peripheral area of the photoelectric conversion region for defining the light admitting region.

10 Claims, 8 Drawing Sheets

SOLID IMAGING DEVICE

BACKGROUND OF THE INVENTION

1. Field of the Invention

The present invention relates to an imaging device, and particularly relates to an imaging device in which the generation of smear is prevented.

2. Background Art

Figure 10A:
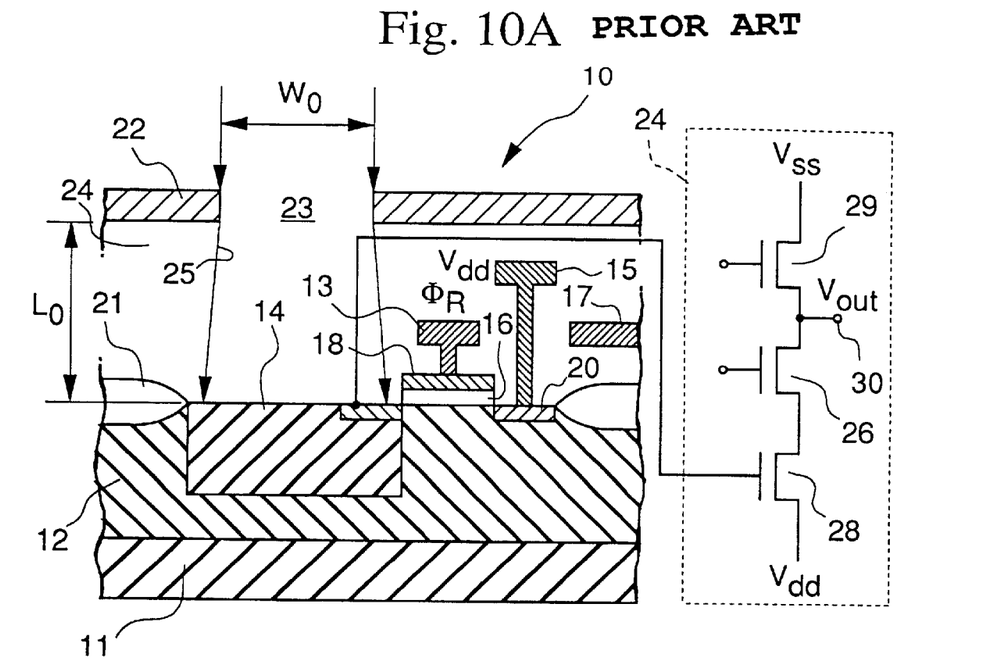
FIGS. 10A and 10B are diagrams showing a schematic side cross-sectional view (9A) and a plan view (9B) of a conventional solid imaging device.
Figure 10B:
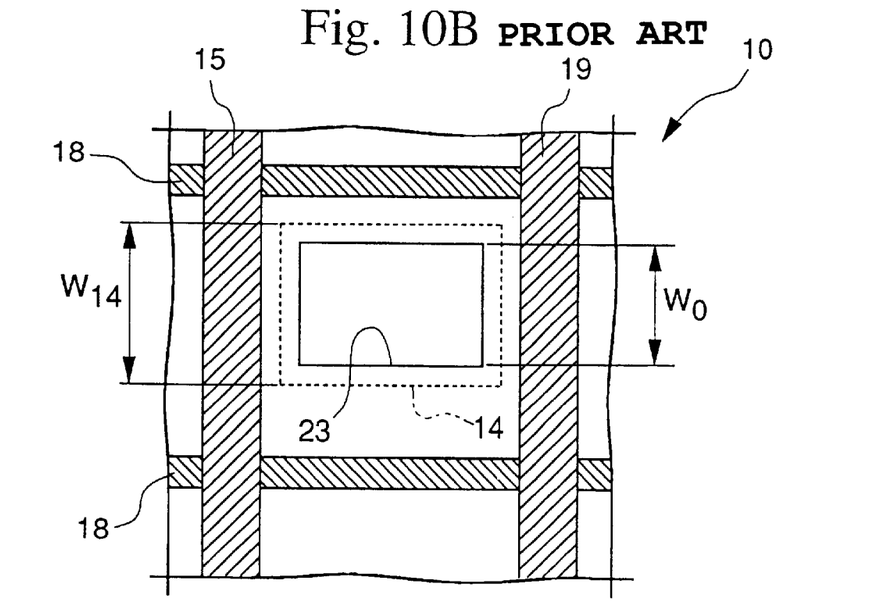

A basic cell of a CMOS sensor, an active type XY address-type solid imaging device is shown in FIG. 10. In FIG. 10, the reference numeral 10 denotes a solid imaging system (a CMOS sensor), 11 denotes a P-type silicon substrate, 12 a P-type well, 14 an N-type region (photoelectric conversion region) forming a photodiode, 16 a gate $SiO_2$ film, 18 a polysilicon film forming a reset gate, 20 an $N^+$ region for forming a reset drain, 21 a field oxide film for element separation, and 22 a metal film for forming a light shield film in which an aperture 23 is formed for defining a light admitting area.

An interlayer insulating film 24 and a plurality of wiring layers 13, 15, 17, 19 are provided between the photoelectric conversion region 14 and the light shielding film 22, and the photoelectric conversion layer 14 is connected with a source-follower-amplifier 24 by a wiring layer (not shown).

The source-follower-amplifier 24 comprises a selection switch MOD transistor 26, a MOS transistor 28 for detection, and a MOD transistor 29 as a load, and the gate of the MOS transistor 28 is connected with the photoelectric conversion region 14.

An operation of such a CMOS sensor constituted as shown above is described as follows. First, by applying a high pulse $\phi_R$ to the reset gate 18, the potential of the N-type region forming the photodiode 14 (photoelectric conversion region) is set. Next, by applying a low pulse $\phi_R$ to the reset gate 18, electric charge generated by the photoelectric conversion is stored in the depleted layer. Depending upon the amount of the stored electric charge, the potential of the N-type region (photoelectric conversion region) 14 is changed, and the potential change is output from an output terminal 30 of the source-follower-amplifier 24.

In the structure of the conventional CMOS sensor 10, since there are many components intervening in between the light shielding film 22 defining the aperture 23 and the photoelectric conversion region 14 on the silicon substrate 11 such as the interlayer insulating film 24 and a plurality of wiring layers 13, 15, 17, 19, the interval $L_0$ between the light shielding film 22 and the photoelectric conversion region 14 becomes as large as a few μm which is far larger than the wavelength of visible light (approximately 80 to 770 nm), and the diffracted light 25 diffracted by the aperture 23 is admitted to the periphery of the photoelectric conversion region 14 as shown in FIG. 10(a).

Therefore, in the structure of the conventional CMOS sensor, a problem arises that false signals (generally called "smear") are generated by the photoelectric conversion due to the expanded beam of light admitted to the periphery of the photoelectric conversion by the light diffraction effect and, thus, the S/N ratio of image signals is degraded.

Although a technique has been proposed in which the size of the aperture 23 (e.g. the width $W_0$) is reduced relative to the size of the photoelectric conversion region 14 (e.g. the width $W_{14}$), a problem has been encountered that this technique causes reduction of the amount of light incident to the photoelectric conversion region, which results in reducing the sensitivity.

SUMMARY OF THE INVENTION

The present invention has been made to solve the above problems and to attain at least one of three objectives described below. That is, the objectives include (1) to reduce smear, (2) to improve the S/N ratio of the image signals, and (3) to provide a solid imaging device having a higher sensitivity than the conventional devices.

The above objects are achieved by providing a solid imaging device comprising: a photoelectric conversion region; a light shielding film having an aperture above said photoelectric conversion region; a plurality of wiring layers disposed at intermediate positions between said light shielding layer and said photoelectric conversion region; wherein, a portion of said wiring layer is disposed protruding inside of said light shielding layer when viewed from the top of the aperture so as to shield the incident light for defining the light admitting region by shielding the incident light admitted to the peripheral area of the photoelectric conversion region.

It is preferable that said wiring layer is made of metal or polysilicon, and it is also preferable that said wiring layer is selected from the group consisting of a Vdd layer connected to said reset drain region, a reset gate wiring layer connected to said reset gate electrode, a reset gate, an XY address wiring layer, and an output wiring layer.

In the present invention, said wiring layer is disposed so as to surround said photoelectric conversion region, disposed so as to intermittently surround said photoelectric conversion region, or said wiring layer is disposed so as to cover at least a portion of said photoelectric conversion region.

In the present invention, a plurality of the wiring layers are located at different heights from said photoelectric conversion region and a plurality of the wiring layers are disposed so as to surround said photoelectric conversion area in combinations of two or more wiring layers.

The solid imaging device of the present invention may be applied as MOS sensors and CCD sensors.

In the solid imaging device of the present invention, since a metal or polysilicon wiring layer disposed inside of the light shielding film is used for shielding the light incident to the photoelectric conversion region and since the wiring layer is disposed close to the photoelectric conversion layer, bending of the incident light by diffraction can be reduced, so that it is possible to reduce the false signals (smears) and to avoid the degradation of the S/N ratio caused by smears trapped in the adjacent photoelectric conversion layer or the diffusion layer in the output circuit.

In the solid imaging device of the present invention, since the wiring layer, protruded inside from the edge of the aperture of the light shielding film is used for shielding the light incident to the peripheral area around the photoelectric conversion region, it becomes possible to increase the light admitting area in the same photoelectric conversion region, which results in increasing sensitivity in the photoelectric conversion and the sensitivity of the solid imaging device.

In the solid imaging device of the present invention, disposition of various wiring layers such as the Vdd wiring layer connected to the reset drain layer, the reset gate layer connected to the reset gate, the reset gate, the XY address wiring layer, or the output wiring layers, having different heights from the photoelectric conversion region, make it possible to reduce the relative distance from the wiring layer to the photoelectric conversion layer, when two or more layers are used in combination for surrounding the photoelectric region.

DETAILED DESCRIPTION OF THE INVENTION

Hereinafter, a first embodiment of the solid imaging device is described with reference to the attached drawings.

Figure 1A:
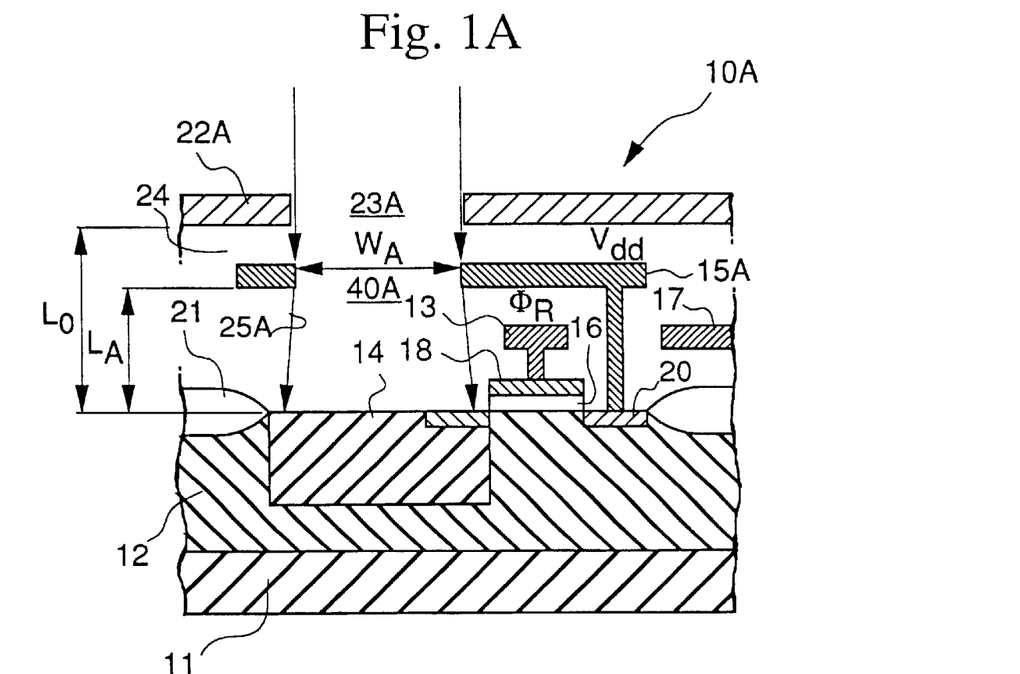
FIGS. 1A and 1B are diagrams showing a side cross-sectional diagram (1A) and a plan view (1B) of a first embodiment of the present invention.
Figure 1B:
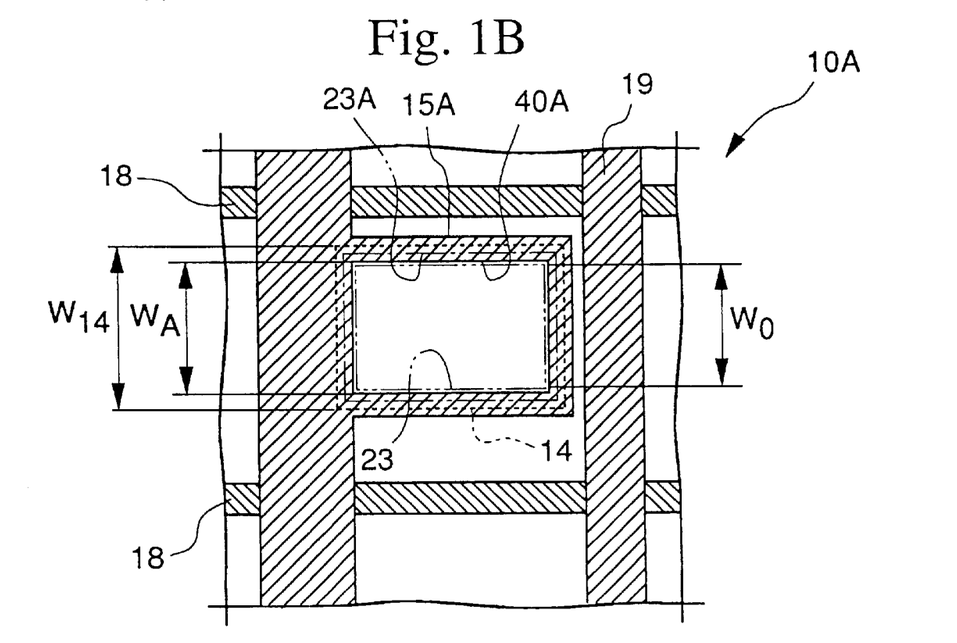
Figure 2:
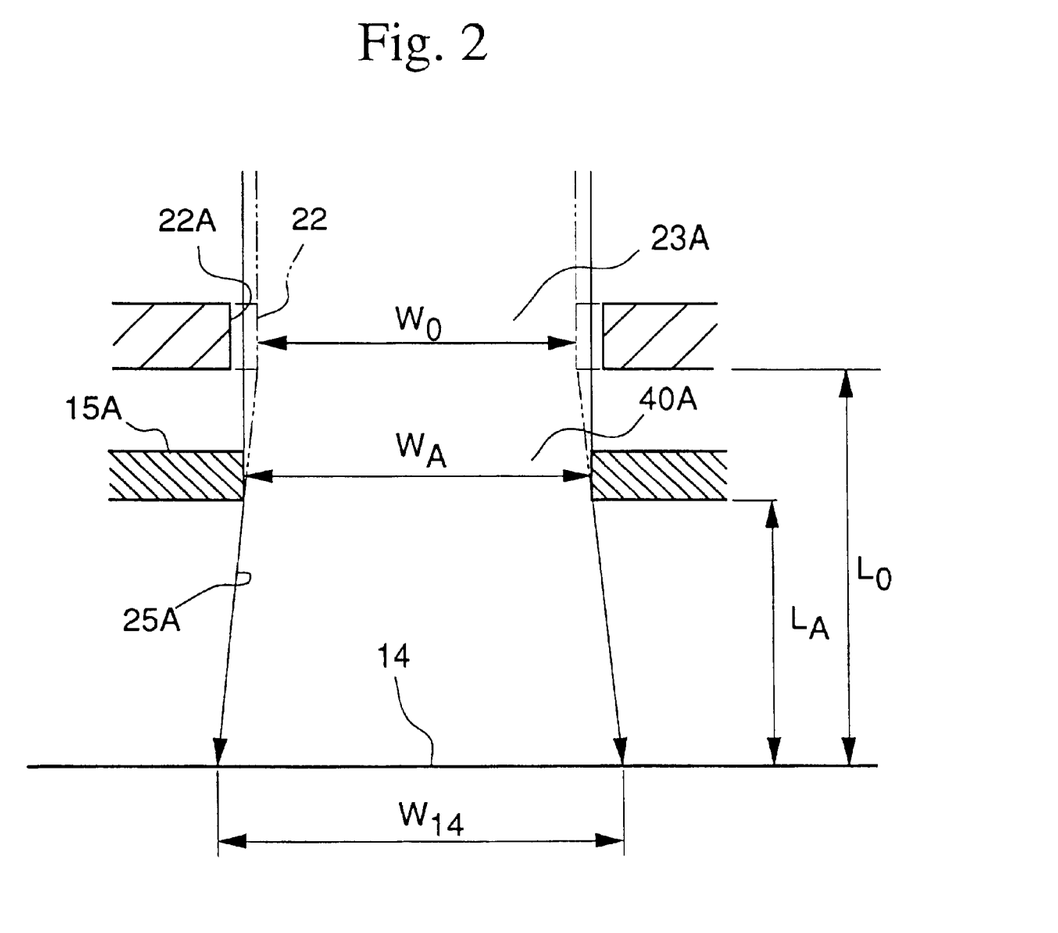
FIG. 2 is an enlarged cross-sectional side view diagram showing the light shielding portions of the photoelectric conversion region, a light shielding film and a wiring layer shown in FIG. 1.

FIGS. 1A and 1B are diagrams showing a side cross-sectional diagram (1A) and a plan view (1B) of a first embodiment of the present invention. FIG. 2 is an enlarged cross-sectional side view showing the light shielding portions of the photoelectric conversion region, a light shielding film and a wiring layer shown in FIG. 1.

In FIGS. 1A, 1B, and 2, the reference numeral 10A denotes a solid imaging device according to the first embodiment, 11 denotes a P-type silicon substrate, 12 a P-type well, 14 an N-type region forming a photodiode (photoelectric conversion region), 16 a gate $SiO_2$ film, 18 a polysilicon film forming a reset gate, 20 an $N^+$-type region forming a reset drain, 21 a field oxide film for separating elements, 22A a metal film for a light shielding film, and 23A denotes an aperture defined in the light shielding film 22A for admitting light.

In the first embodiment, the solid imaging device 10A is constituted for active-type XY address-type CMOS sensors. The basic cell of the CMOS sensors, as shown in FIG. 1, comprises a photoelectric conversion region 14, a light shielding film 22A having an aperture 23A opened above the photoelectric conversion region 14, and wiring layers 13, 15A, 17, 19 made of a plurality of metal or polysilicon provided in a midway position between the photoelectric conversion region 14 and the light shielding film 22A.

In a space between the photoelectric conversion region 14 and the light shielding layer 22, an interlayer insulating film 24 is provided, a plurality of wiring layers 13, 15A, 17, and 19 are formed in the interlayer insulating film, and the photoelectric conversion region is connected to the source follower amplifier 24 shown in FIG. 10.

The above wiring layers 13, 15A, 17, 19 includes, for example, a Vdd wiring layer sower source wiring layer) 15A made of a metal such as aluminum metal and connected to the reset drain region 20, a reset gate wiring layer 13 made of metal such as aluminum and connected to the reset drain region 20, an X Y address selection wiring layer 17 made of aluminum and the like, and a column wiring layer (output wiring layer) 17.

Here, as shown in FIG. 1B, the Vdd wiring layer 15A is disposed protruding into the inside of the aperture 23A when viewed from the top of the aperture so as to define the light admitting region by shielding light incident on the periphery of the photoelectric conversion region 14, and the Vdd wiring layer 15A is arranged around the photoelectric conversion region 14 so as to surround the photoelectric conversion region 14.

The size (e. g., the width $W_A$) of the aperture 40A of the Vdd wiring layer 15A is set so as to satisfy the following relationships with the size (e. g., the width $W_0$) of the aperture of the light shielding film 22 shown in FIG. 10 and the size (e. g., the width $W_{14}$) of the photoelectric conversion region 14 as:

$$W_0 < W_A < W_{14}$$

The operation of the above-mentioned solid imaging device is described hereinafter. First, the potential of the N-type region (photoelectric conversion region), which forms the photodiode, is set by applying a high pulse $\phi_R$ to the reset gate 18. Next, the electric charge generated by the photoelectric conversion is stored in the depleted layer by applying a low pulse to the reset gate 18. The potential of the photoelectric conversion region 14 fluctuates in accordance with the amount of the stored charge, and the fluctuation of the potential is output from the output terminal.

At this time, a part of the incident light 25A incident from the side of the light shielding film 22A is being subjected to diffraction by the diffraction effect of the aperture 23A, and is admitted into the periphery of the photoelectric conversion portion 14. Although the incident light 25A is subjected to diffraction by the periphery of the aperture 23A, since the Vdd wiring layer 15A is disposed protruding into the inside of the aperture, when viewed from the top of the aperture, as shown in FIGS. 1B and 2, the incident light incident into the photoelectric portion is defined by shielding the periphery of the incident light by the protruded wiring layer from the aperture.

Here, as shown in FIGS. 1A, 1B and 2, the distance or the height $L_A$ between the Vdd wiring layer defining the aperture 40A and the photoelectric conversion region 14 on the silicon substrate 11 is related to the distance or the height $L_0$ between the light shielding film 22A defining the aperture 23A and the photoelectric conversion region 14 as follows:

$$L_A < L_0$$

Since the difference $L_A$ is shorter than the distance $L_0$, the extension of the incident light 25A by the diffraction effect becomes smaller by the use of the Vdd layer. Consequently, it is possible to reduce the amount of the light incident to the periphery of the photoelectric conversion region 14 and to reduce the smear generated by photoelectric conversion, which results in improving the S/N ratio of the image signals.

As described above and as shown in FIGS. 1B and 2, the Vdd wiring layer is disposed around the periphery of the photoelectric conversion region 14 so as to surround the whole periphery protruding inside of the aperture when viewed from the top of the aperture such that the light admitting area is defined by the Vdd wiring layer by shielding the light incident to the peripheral portion of the photoelectric conversion region 14.

That is, since the amount of light incident to the photoelectric conversion region 14 is proportional to the size of the aperture, it is possible to increase the amount of light incident to the photoelectric conversion region and to prevent the degradation of the sensitivity compared to the case of admitting light only through the aperture 23 by using a design in which the size (e. g., the width $W_A$) of the aperture 40A of the Vdd wiring layer satisfies the following relationship with the size (e. g., the width $W_0$) of the aperture 23 of the light shielding film 22.

$$W_0 < W_A$$

According to the first embodiment of the solid imaging device of the present invention, it is possible to reduce the distance $L_A$ between the portion defining the photoelectric conversion region 14 and the photoelectric conversion region 14 and to reduce expansion of the incident light due to the light diffraction by shielding the incident light by the use of the Vdd wiring layer 15A made of metal disposed protruding to the inside of the aperture 23A. Thus, it becomes possible to reduce the possible admission of light to the periphery of the photoelectric conversion region 14 and to reduce the generation of smear, which results in preventing the degradation of the S/N ratio due to the smear trapped by the other adjacent photoelectric conversion region or by the diffusion layer of the output circuit.

The disposition of the Vdd wiring layer for shielding the light to be incident to the periphery of the photoelectric conversion region 14 has made it possible to reduce the height of the Vdd wiring layer from the photoelectric conversion layer, so that it becomes possible to increase the relative light admitting area to the same photoelectric conversion region 12. Accordingly, the amount of incident light increases, the sensitivity of the photoelectric conversion increases, and the sensitivity of the solid imaging device 10A is improved.

Figure 3:
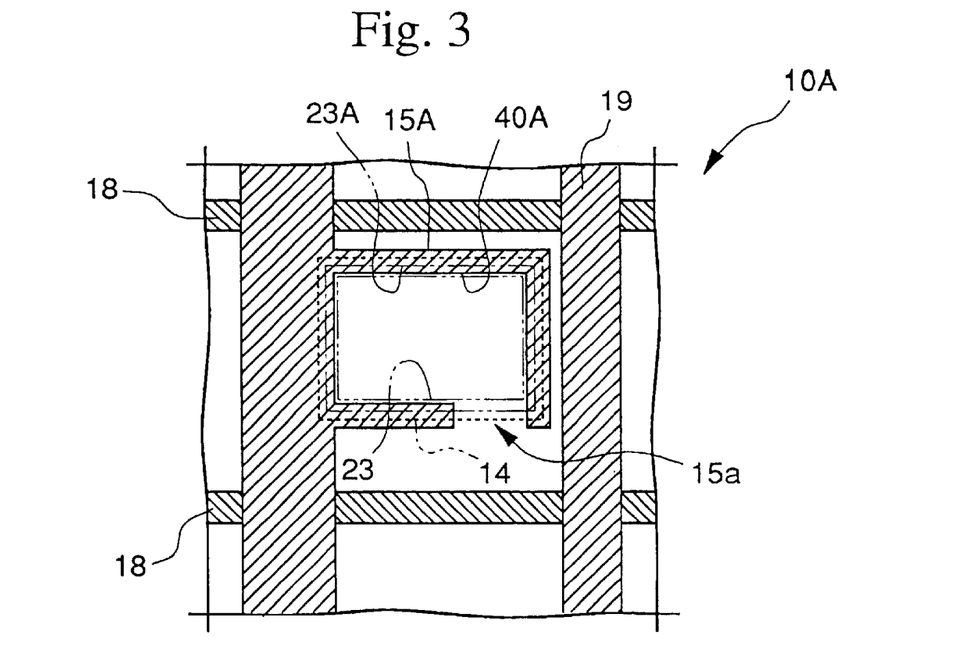
FIG. 3 is a plan view showing an example of a position of the wiring layer with respect to the photoelectric conversion layer.
Figure 4:
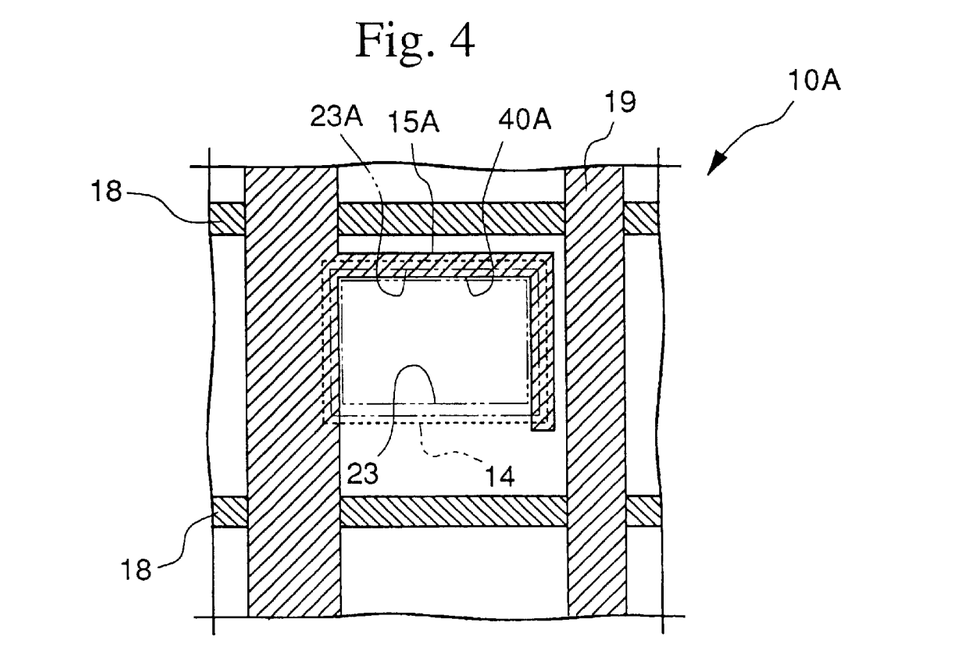
FIG. 4 is a plan view showing an example of a position of the wiring layer with respect to the photoelectric conversion layer.
Figure 5:
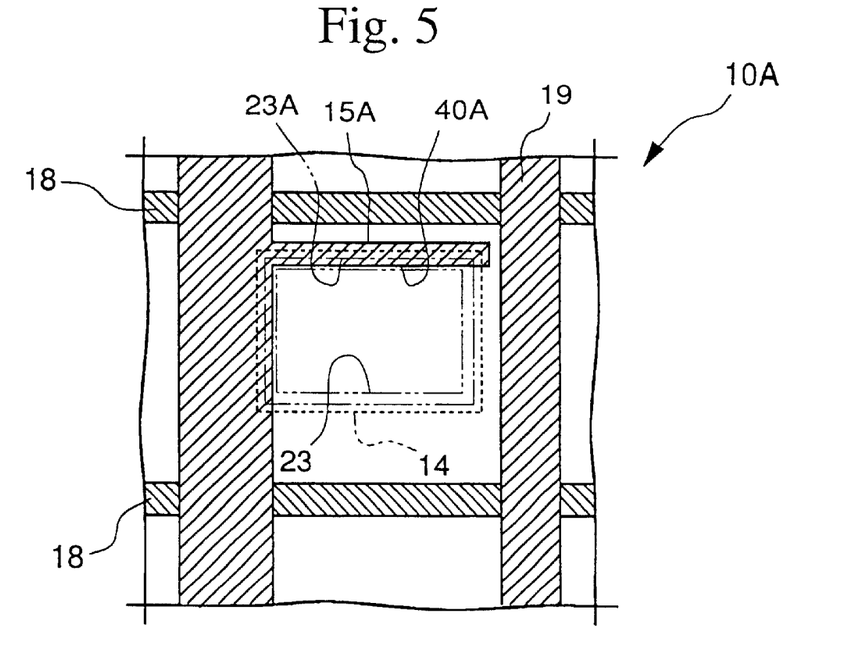
FIG. 5 is a plan view showing an example of a position of the wiring layer with respect to the photoelectric conversion layer.
Figure 6:
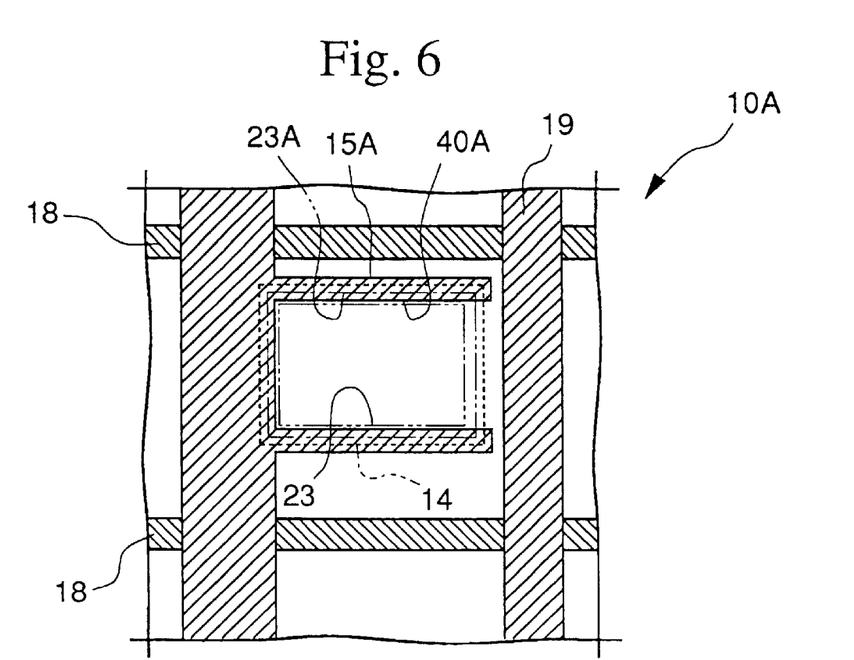
FIG. 6 is a plan view showing an example of a position of the wiring layer with respect to the photoelectric conversion layer.

In the first embodiment, although the Vdd wiring layer 15A is disposed so as to surround the periphery of the photoelectric conversion region 14, it is possible to dispose the Vdd wiring layer 14 so as to surround the periphery of the photoelectric conversion region 14 intermittently; in another words, the Vdd wiring layer is disposed all around the periphery of the photoelectric conversion region 14 except for notches 15a; or is disposed on at least a part of the periphery of the photoelectric conversion region 14, that is, disposed so as to cover two consecutive sides, two separated sides, or one side of the photoelectric conversion region. In these cases, the effect of the Vdd wiring layer is obtained at a portion of the periphery covered by the Vdd wiring layer.

It is also possible to finally surround the periphery of the photoelectric conversion region 14 by combining the Vdd wiring layer with other wiring layers 13, 17, and 19, which may have the same or different heights from the photoelectric conversion region 14 in the direction of the incident light when viewed from the top of the photoelectric conversion region. Thereby, the effects described above are obtained such as the reduction of the generation of smear, prevention of the degradation of the S/N ratio, and improvement of the sensitivity.

Hereinafter, the second embodiment of the present solid imaging device will be described with reference to the attached drawings.

Figure 7A:
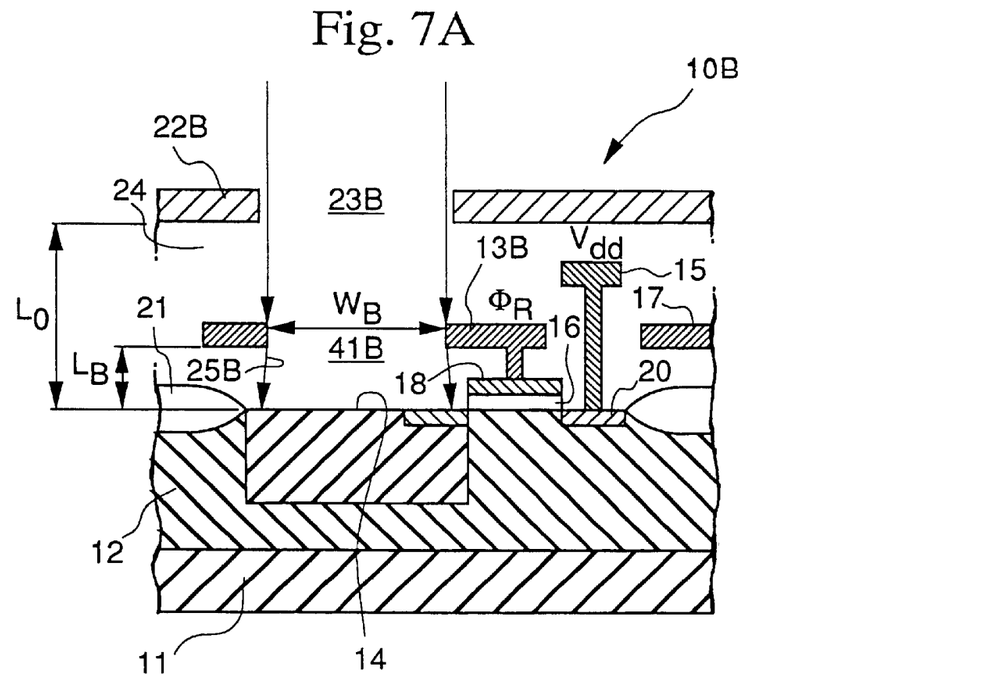
FIGS. 7A and 7B are diagrams showing a side cross-sectional diagram (7A) and a plan view (7B) of a second embodiment of the present invention.
Figure 7B:
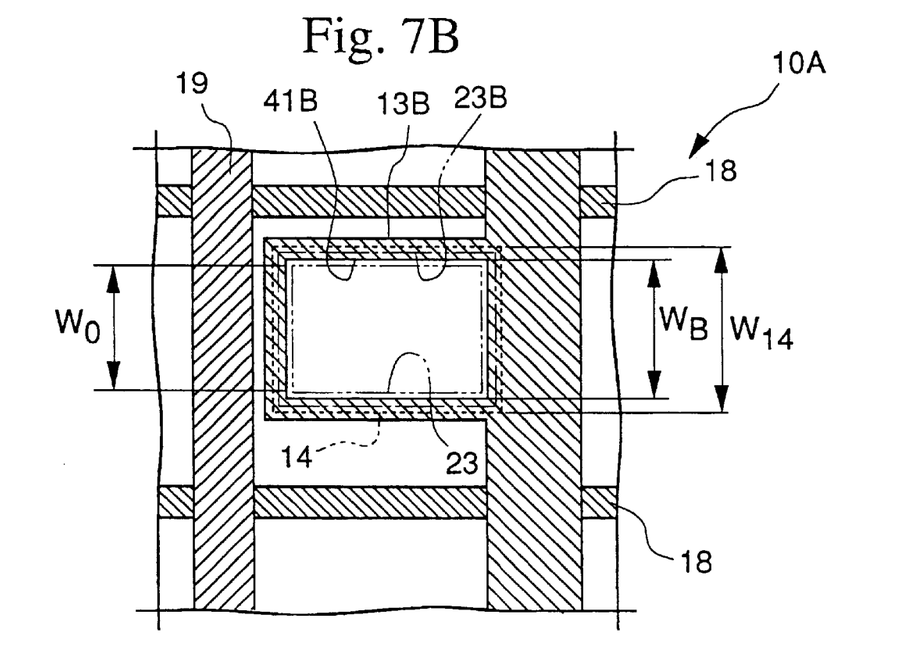
Figure 8:
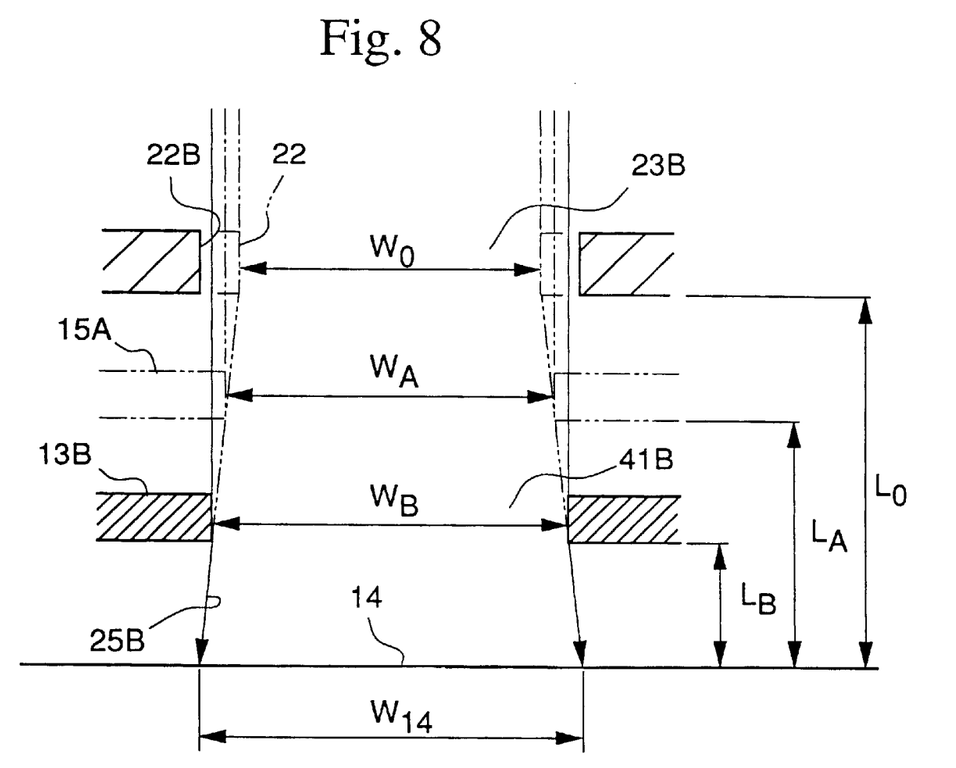
FIG. 8 is an enlarged cross-sectional side view diagram showing the light shielding portions of the photoelectric conversion region, a light shielding film and a wiring layer shown in FIG. 7.

FIGS. 7A and 7B are diagrams showing a cross-sectional side view (7A) and a cross-sectional plan view (7B) of a second embodiment of the present invention. FIG. 8 is an enlarged cross-sectional side view diagram showing the photoelectric conversion region 14, the light shielding film, and a wiring layer shown in FIGS. 7A and 7B.

In the present embodiment, the same constitutional elements as in the first embodiment as shown in FIGS. 1 to 6 are denoted by the same numerals and explanations of these components are omitted. In FIGS. 7A, 7B and 8, the numeral 10B denotes a solid imaging device of this embodiment, 15 denotes a Vdd wiring layer connected to the reset drain layer, 22B a metal film forming a light shielding film, and 23B denotes an aperture for admitting incident light defined in the light shielding film 22B.

In the present embodiment, a point which differs from the first embodiment shown in FIGS. 1 to 6 is that the reset gate wiring layer is selected as the wiring layer which defines the light incident region.

Here, the reset gate wiring layer is disposed at a closer position to the photoelectric conversion region 14, since the height or the distance of the gate wiring layer to the photoelectric conversion region 14 is lower than that of the Vdd wiring layers 15A shown in FIGS. 1 and 2.

As shown in FIG. 8, the height $L_B$ of the reset gate wiring layer 13B from the photoelectric conversion region on the silicon substrate is lower than the height $L_0$ of the light shielding film defining the aperture 23B from the photoelectric conversion region 14, and the height $L_A$ of the Vdd wiring layer in the first embodiment illustrated in FIGS. 1 and 2, as follows.

$$L_B < L_A < L_0$$

The reset gate wiring layer 13B is disposed such that it surrounds the periphery of the photoelectric conversion region 14 so as to define the light admitting area by shielding the incident light for the peripheral portion of the light admitting portion and the reset gate wiring layer 13B is located around the photoelectric conversion region 14 so as to surround the whole periphery of the photoelectric conversion region 14.

The size of the aperture 41B of the reset gate wiring layer 13B (e. g., the width $W_B$) is set so as to satisfy the following relationship with the size of the aperture 23 (e. g., the width $W_0$), and with the size of the photoelectric conversion region 14 (e. g., the width $W_{14}$) as follows.

$$W_0 < W_B < W_{14}$$

An operation of the solid imaging device 10B of the present embodiment is approximately identical with that of the solid imaging device of the first embodiment.

During operation, a part of the light 25B incident from the light shielding film 22B expanding by the diffraction effect is admitted to the peripheral area of the photoelectric region as shown in FIG. 8. This part of the incident light 25B is diffracted by the periphery of the aperture 23B of the light shielding film 22B. However, when the reset gate wiring layer 13B is disposed so as to protrude inside the periphery of the aperture 23B, as shown in FIGS. 7B and 8, when viewed from the top of the aperture, the light admitting region can be defined by shielding the incident light incident to the periphery by the aperture 22B of the reset gate wiring layer 13B.

Here, as shown in FIG. 8, the interval $L_B$ of the reset gate wiring layer 13B which defines the aperture 23B from the photoelectric conversion region 14 on the silicon substrate 11 is related to the height $L_0$ of the light shielding film 22B which defines the aperture 23B from the photoelectric conversion region 14 (which is identical with the height $L_0$ of the light shielding film 22 which defines the aperture 22 shown in FIG. 10) as follows.

$$L_B < L_0$$

That is, in this embodiment, the expansion of the incident light is further reduced by the use of the reset gate wiring layer, than in the case of using the aperture of the light shielding film.

Furthermore, as shown in FIG. 8, the interval $L_B$ of the reset gate wiring layer 13B defining the aperture 41B from the photoelectric conversion region 14 on the silicon substrate 11 is related to the interval $L_A$ between the Vdd wiring layer 15A shown in FIGS. 1 and 2 and the photoelectric conversion region 14 on the silicon substrate 11 as follows.

$$L_B < L_A$$

The above relationship indicates that the height causing the expansion of the incident light 25B by the diffraction effect is further shorter than the height of the Vdd wiring layer in the first embodiment shown in FIGS. 1 and 2 from the photoelectric conversion region 14 on the silicon substrate 11. Consequently, it becomes possible to reduce the amount of light incident to the peripheral area around the photoelectric conversion region and to reduce the generation of the smear caused in the photoelectric conversion region 14, which results in improving the S/N ratio of the imaging signals.

As shown in FIGS. 7B and 8, since the reset gate wiring layer 13B is disposed so as to surround the entire peripheral area of the photoelectric conversion region 14 and to protrude inside from the aperture 23B when viewed from the top of the aperture, the light admitting region is defined by shielding the light incident to the periphery of the photoelectric conversion region 14 by aperture 41B of the reset gate wiring layer 13B.

That is, the size (e. g., the width $W_B$) of the aperture 41B of the reset gate wiring layer 13B is designed so as to satisfy the following relationship with the size (e. g., the width $W_0$) of the aperture 23 shown in FIG. 10 in order to establish a proportional relationship between the amount of light incident to the photoelectric conversion region 14 and the size of these apertures, as:

$$W_0 < W_B$$

As a result, it becomes possible to increase the amount of light admitted to the photoelectric conversion region 14 when the light passes through the aperture 41B of the reset gate wiring layer 13B compared to the case of the incident light passing through the aperture 23, which allows preventing the degradation of the sensitivity.

Furthermore, as shown in FIG. 8, since the height $L_B$ of the reset gate wiring layer 13B which defines the aperture 41B from the photoelectric conversion region 14 on the silicon substrate 11 is designed such that it relates to the height $L_A$ of the Vdd wiring layer 15A shown in FIGS. 1 and 2 from the photoelectric conversion region 14 on the silicon substrate 11 as follows, $$L_B < L_A$$

and, since the size (e. g., the width $W_B$) is designed such that it relates to the size of the aperture 15A of the Vdd wiring layer in the first embodiment as shown in FIGS. 1 and 2, as;

$$W_A < W_B$$

it is possible to increase the amount of light admitted to the photoelectric conversion region 14 when the light passes through the aperture 41B of the reset gate wiring layer 13B compared to the first embodiment in which the incident light passes through the aperture 40A of the Vdd wiring layer 15A, which allows further preventing the degradation of the sensitivity.

According to the solid imaging devices 10B of the second embodiment, it is possible to reduce the expansion of the beam of the incident light 25B due to the diffraction effect by lowering the height $L_B$ of the reset gate wiring layer 13B, made of a metal layer located inside of the light shielding film 22B, defining the light admitting area to the photoelectric conversion region 14, so that the light incident to the peripheral area around the photoelectric conversion area 14 is reduced for further reducing the smear. Thereby, it becomes possible to prevent the degradation of the S/N ratio of the image signals due to smear due to light being trapped by the photoelectric conversion region or the diffusion layer in the output circuit.

In the solid imaging device of the present embodiment, the reset gate wiring layer disposed inside of the light shielding film 22B shields the light incident to the peripheral area of the photoelectric conversion region 14, and lowering of the height of the reset gate layer 13B from the photoelectric conversion region 14 reduces the expansion of the incident light 25B by the diffraction, the light admitting area for the identical photoelectric conversion region 14 can be increased, and as a result, the amount of light incident to the photoelectric conversion region can be increased, which results in improving the sensitivity of the photoelectric conversion as well as the sensitivity of the solid imaging device.

In the second embodiment, the reset gate wiring layer 13B is disposed so as to surround the photoelectric conversion region 14. Besides, the reset gate wiring layer may be disposed so as to surround the photoelectric conversion region intermittently; in another words, the reset gate wiring layer 13B may be disposed all around the periphery of the photoelectric conversion region 14 including notches 15a; or disposed around at least a part of the periphery of the photoelectric conversion region 14, that is, disposed so as to cover two consecutive sides, two separated sides, or one side of the photoelectric conversion region. In these cases, the effect of the reset gate wiring layer is obtained at a portion of the periphery of the photoelectric conversion region.

It is also possible to entirely surround the periphery of the photoelectric conversion region 14 by combining the reset gate wiring layer with other wiring layers 13, 17, and 19, having different heights from the photoelectric conversion region 14 in the direction of the incident light when viewed from the top of the photoelectric conversion region. Thereby, the effects described above are obtained such as the reduction of the generation of the smear, prevention of the degradation of the S/N ratio, and the improvement of the sensitivity.

Hereinafter, the third embodiment of the present invention will be explained with reference to the attached drawings.

Figure 9A:
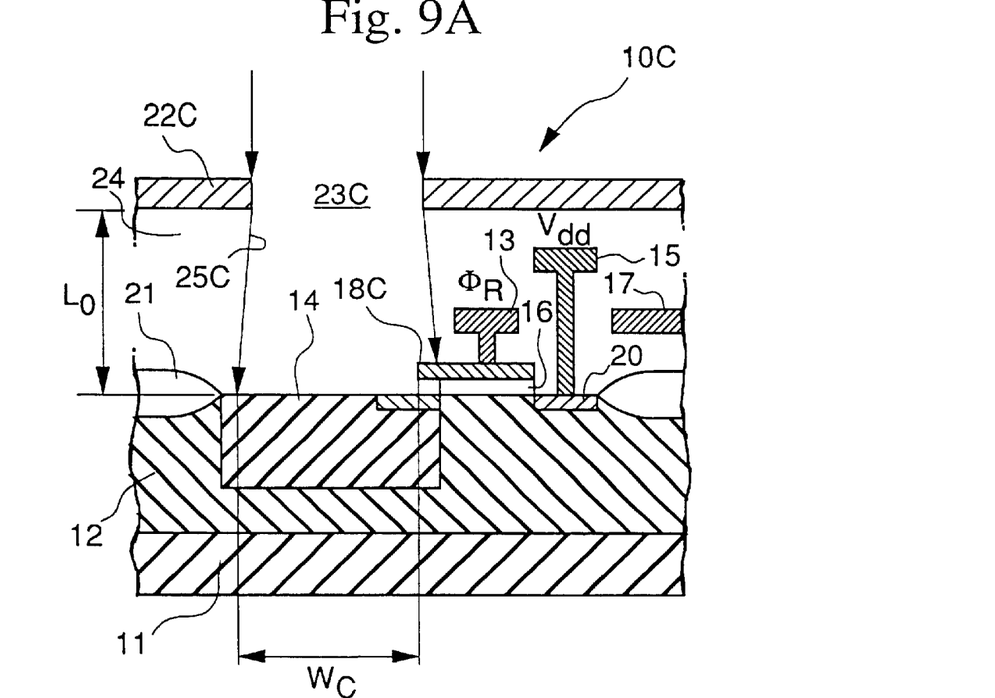
FIGS. 9A and 9B are diagrams showing a schematic side cross-sectional view (9A) and a plan view (9B) of a third embodiment of the present invention.
Figure 9B:
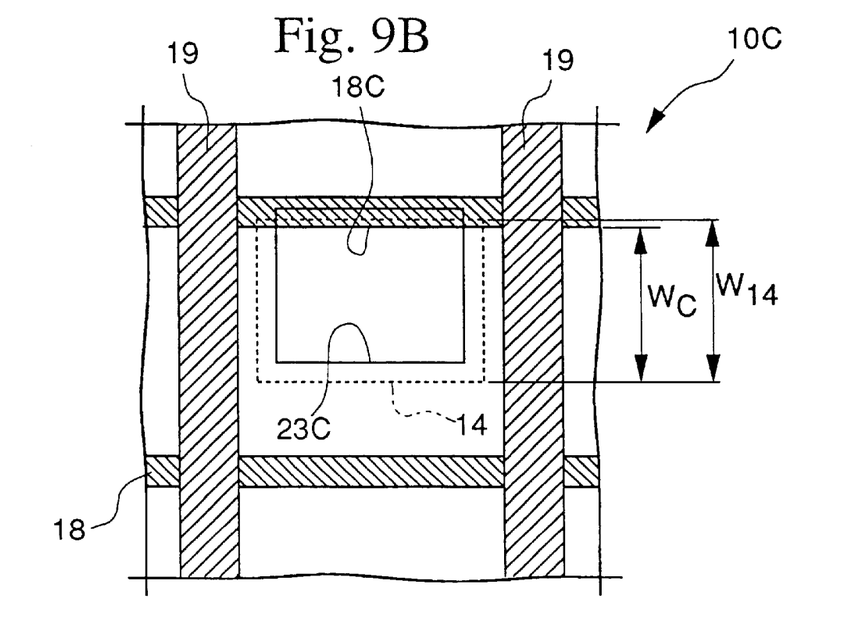

FIGS. 9A and 9B are diagrams showing a schematic side cross-sectional view (9A) and a plan view (9B) of a third embodiment of the present invention.

In the present embodiment, the same constitutional elements in the first embodiment shown in FIGS. 1 to 6 are denoted by the same numerals and explanations of these components are omitted. In FIGS. 9A, 9B, the numeral 10C denotes a solid imaging device of the third embodiment, 15 denotes a Vdd wiring layer connected to the reset drain layer, 22C a metal film of a light shielding film, and 23C denotes an aperture for admitting incident light defined by the light shielding film 22B.

In the present embodiment, a point which differs from the first embodiment shown in FIGS. 1 to 6 is that the reset gate 18C made of polysilicon is selected as the wiring layer which defines the light admitting region.

Here, the reset gate 18C is disposed in a closer position to the photoelectric conversion region 14, since the height of the reset gate from the photoelectric conversion region 14 is lower than those of the Vdd wiring layer 15A shown in FIG. 2 and the reset gate wiring layer 13B shown in FIG. 8.

As shown in FIG. 8, the reset gate 18C is formed on the gate $SiO_2$ layer which is located at approximately the same height as that of the photoelectric conversion region 14.

Here, the reset gate 18C, as shown in FIG. 9B, is disposed protruding to the inside of the aperture 23C so as to define the light admitting region, when viewed from the top of the aperture, by surrounding the peripheral area of the photoelectric conversion region 14, and in this case, the reset gate 18C is disposed closer to the photoelectric conversion region 14 than the Vdd layer 15A of the first embodiment shown in FIG. 2 or the reset gate wiring layer 13B of the second embodiment shown in FIG. 8.

As shown in FIG. 8, the reset gate 18C is disposed on the gate $SiO_2$ layer which is located at the same height as the photoelectric conversion layer 14.

In this embodiment, the reset gate 18C protrudes inwardly from the edge of the aperture 23C when viewed from the top of the aperture 13C so as to shield the light incident to the peripheral area of the photoelectric conversion region 14, and in this embodiment the reset gate only occupies one side of the photoelectric conversion region 14.

The size (e. g., the width $W_C$) from the inner end of the reset gate 18C to a facing side of the photoelectric conversion region 14 is designed so as to satisfy the following relations with the size (e. g., the width $W_0$) shown in FIG. 10, the size (e. g., the width $W_B$) of the aperture 41B of the reset gate wiring layer 13B, and the size (e. g., the width $W_{14}$);

$$W_0 < W_B < W_C < W_{14}$$

The operation of the solid imaging device of the present embodiment is similar to the first and second embodiments.

The incident light 25C incident from the light shielding film 22C is admitted to the periphery of the photoelectric conversion region 14 as shown in FIG. 9A after being diffracted by the diffraction effect at the aperture 23C. Although the incident light 25C is diffracted by the aperture 23C of the light shielding film 22C, the light admitting region in the photoelectric conversion region 14 is defined, since the incident light is shielded by the reset gate 18C which is protruded inwardly from the aperture 23C when viewed from the top of the aperture.

As shown in FIG. 8, there is no room for the incident light to be diffracted in between the reset gate 18c and the photoelectric conversion region 14. Thereby, it is possible for the present embodiment to reduce the amount of light incident to the periphery of the photoelectric conversion region and to reduce the smear generated by the diffracted light to improve the S/N ratio of the image signals, when comparing with the Vdd wiring layer 15A defining the aperture 40A in the first embodiment shown in FIG. 1, and the reset gate wiring layer 13B defining the aperture 41B in the second embodiment shown in FIG. 8.

As shown in FIG. 9A, the reset gate 18C, which is disposed on one side of the photoelectric conversion region and is protruded inwardly from the aperture 23C, defines the light admitting region by shielding light 25C admitted into the photoelectric conversion region 14.

The amount of light incident to the photoelectric conversion region 14 is proportional to the size (e. g., the width $W_C$) from the inner side of the reset gate 18C to the counter side of the photoelectric conversion region 14 and the width is designed so as to satisfy the following relations with the size (e. g., the width $W_B$) of the aperture 41B defined in the reset gate wiring layer 13B and the size of the aperture 23 (e. g., the width $W_0$) as follows.

$$W_0 < W_B < W_C$$

As a result, it is possible to further increase the amount of light incident to the photoelectric conversion region and to prevent degradation of the sensitivity, when the light admitting area is defined by the reset gate 18C than the case of being defined by the aperture 23 shown in FIG. 10.

According to the solid imaging device of the present embodiment, the expansion of the diffracted light can be reduced by lowering the height of the wiring layer defining the light admitting area from the photoelectric conversion region 14 in order to shield the incident light 25C from the peripheral area of the photoelectric conversion region 14 by the rest gate 18C disposed inside of the light shielding film 22C. Accordingly, it becomes possible to reduce the light incident to the peripheral portion of the photoelectric conversion region and to reduce the possibility of generating the resultant smear, so that the degradation of the S/N ratio of the image signals due to the smear due to light trapped in the adjacent photoelectric conversion region and the diffusion layer of the output circuit.

According to the solid imaging device of the present embodiment, the height from the photoelectric conversion region to the reset gate 18C, which shields the light 25C incident to the peripheral portion of the photoelectric conversion region for defining the light admitting region, is further reduced, so that the effects of the present embodiment are obtained in that the light admitting area can be increased and in that it becomes possible to improve the sensitivity of the photoelectric conversion as well as the sensitivity of the solid imaging device 10C.

In the present embodiment, the reset gate 18C is disposed so as to cover one side of the photoelectric conversion region. However, it is also possible to entirely surround the periphery of the photoelectric conversion region 14 by combining the reset gate 18C with other wiring layers 13, 17, and 19, having different heights from the photoelectric conversion region 14 in the direction of the incident light, when viewed from the top of the photoelectric conversion region. Thereby, the effects described above are obtained such as the reduction of the generation of the smear, prevention of the degradation of the S/N ratio, and the improvement of the sensitivity.

Besides, as described in the first embodiment shown in FIG. 3, it is possible to dispose the reset gate 18C so as to surround the periphery of the photoelectric conversion region 14 intermittently; in another words, the reset gate layer 18C is disposed all around the periphery of the photoelectric conversion region 14 except notches 15a; or disposed at least around a part of the periphery of the photoelectric conversion region 14, that is, disposed so as to cover two consecutive sides, two separated sides, or one side of the photoelectric conversion region.

Although the present invention is explained concerning the CMOS sensors, it should be noted that the present invention can be applied to other applications such as CCD sensors.

In addition, it should be noted that any wiring layers such as an output wiring layer made of metal other than the above described metal wiring layers may be used for defining the light admitting region.

The following effects are obtained by the solid imaging device of the present invention.

(1) In the present solid imaging device, since a metal or polysilicon wiring layer disposed inside of the light shielding film is used for shielding the light incident to the photoelectric conversion region and since the wiring layer is disposed close to the photoelectric conversion layer, bending of the incident light by diffraction can be reduced, so that it is possible to reduce the false signals (smears) and to avoid the degradation of the S/N ratio caused by smears caused by light trapped in the adjacent photoelectric conversion layer or the diffusion layer in the output circuit.

(2) In the present solid imaging device, since the wiring layer, protrudingly disposed inwardly from the edge of the aperture of the light shielding film is used for shielding the light incident to the peripheral area around the photoeletric conversion region, it becomes possible to increase the light admitting area in the same photoelectric conversion region, which results in increasing the sensitivity of the photoelectric conversion and the sensitivity of the solid imaging device.

(3) The disposition of various wiring layers such as the Vdd wiring layer connected to the reset drain layer, the reset gate layer connected to the reset gate, the reset gate, the XY address wiring layer, or the output wiring layers, located at the same or different heights from the photoelectric conversion region, my be used so as to surround the periphery of the photoelectric conversion region alone or in combinations of two or more, makes it possible to reduce the relative distance from the wiring layer to the photoelectric conversion layer, when a plurality of wiring layers are used in combinations of two or more layers.

What is claimed is:

1. A solid imaging device comprising:
    a photoelectric conversion region within a separating film on a substrate and having a cross-section width;
    a light shielding film having an aperture above said photoelectric conversion region;
    a plurality of wiring layers disposed in an interlayer insulation film at intermediate positions between said light shielding layer and said photoelectric conversion region;
    wherein, a portion of said wiring layer is disposed protruding inside of said light shielding layer when viewed from the top of the aperture so as to form a shield aperture shielding the incident light for defining the light admitting region by shielding the incident light admitted to the peripheral area of the photoelectric conversion region, the cross-section width of the shield aperture being less than the cross-section width of the photoelectric conversion region.

2. A solid imaging device according to claim 1, wherein said wiring layer is disposed so as to surround said photoelectric conversion region.

3. A solid imaging device according to claim 2, wherein said wiring layer is disposed so as to intermittently surround said photoelectric conversion region.

4. A solid imaging device according to claim 1, wherein said wiring layer is disposed so as to cover at least a portion of said photoelectric conversion region.

5. A solid imaging device according to claim 1, wherein said plurality of said wiring layers are disposed at different intervals from said photoelectric conversion area.

6. A solid imaging device according to claim 3, wherein said plurality of said wiring layers are disposed so as to surround said photoelectric conversion area in a combination of two or more.

7. A solid imaging device according to claim 1, wherein said wiring layer is made of metal or polysilicon.

8. A solid imaging device according to claim 1, wherein the solid imaging device comprises a rest drain region and a reset gate electrode,
    wherein said wiring layer is selected from the group consisting of a Vdd layer connected to said reset drain region, a reset gate wiring layer connected to said reset gate electrode, a reset gate, an XY address wiring layer, and an output wiring layer.

9. A solid imaging device according to claim 1, wherein said solid imaging device includes MOS sensors and CCD sensors.

10. A solid image device according to claim 1, wherein the shield aperture cross-section width is greater than a cross-section width of the aperture of the light shielding film.

* * * * *